US010734454B2

(12) United States Patent
Benoit et al.

(10) Patent No.: US 10,734,454 B2
(45) Date of Patent: Aug. 4, 2020

(54) DISPLAY STACK INCLUDING EMISSIVE DISPLAY AND COLOR CORRECTION FILM

(71) Applicant: 3M INNOVATIVE PROPERTIES COMPANY, St. Paul, MN (US)

(72) Inventors: Gilles J. Benoit, Minneapolis, MN (US); Daniel J. Schmidt, Woodbury, MN (US); Stephen P. Maki, North St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 14 days.

(21) Appl. No.: 16/329,777

(22) PCT Filed: Aug. 30, 2017

(86) PCT No.: PCT/US2017/049438
§ 371 (c)(1),
(2) Date: Mar. 1, 2019

(87) PCT Pub. No.: WO2018/045070
PCT Pub. Date: Mar. 8, 2018

(65) Prior Publication Data
US 2019/0245010 A1  Aug. 8, 2019

Related U.S. Application Data

(60) Provisional application No. 62/383,058, filed on Sep. 2, 2016.

(51) Int. Cl.
*H01L 21/00* (2006.01)
*H01L 27/32* (2006.01)
*H01L 51/52* (2006.01)

(52) U.S. Cl.
CPC ........ *H01L 27/322* (2013.01); *H01L 27/3209* (2013.01); *H01L 27/3211* (2013.01);
(Continued)

(58) Field of Classification Search
CPC ............. H01L 27/3209; H01L 27/3211; H01L 51/5262; H01L 51/5275; H01L 51/5281; H01L 51/5293
See application file for complete search history.

(56) References Cited

U.S. PATENT DOCUMENTS 5,126,394 A  6/1992 Revis
7,018,713 B2  3/2006 Padiyath
(Continued)

FOREIGN PATENT DOCUMENTS

CN  103579520  9/2016
EP  2894688  7/2015

OTHER PUBLICATIONS

Krogman, "Automated Process for Improved Uniformity and Versatility of Layer-by-Layer Deposition," Langmuir 2007, vol. 23, pp. 3137-3141.
(Continued)

*Primary Examiner* — Richard A Booth
(74) *Attorney, Agent, or Firm* — Jeffrey M. Olofson

(57) ABSTRACT

Display stacks are disclosed. More specifically, display stacks including an emissive display including a plurality of organic light emitting diodes, a circular polarizer, and a color correction film disposed between the emissive display and the circular polarizer are disclosed. The color correction film includes a plurality of microlayers and may provide reduced color shift performance between on and off-axis viewing angles compared to display stacks not including the color correction film.

20 Claims, 2 Drawing Sheets

(52) U.S. Cl.
CPC ...... *H01L 51/5262* (2013.01); *H01L 51/5275* (2013.01); *H01L 51/5281* (2013.01); *H01L 51/5293* (2013.01)

(56) References Cited

U.S. PATENT DOCUMENTS

| | | |
|---|---|---|
| 8,234,998 B2 | 8/2012 | Krogman |
| 8,313,798 B2 | 11/2012 | Nogueira |
| 2006/0066228 A1 | 3/2006 | Antoniadis |
| 2007/0057251 A1 | 3/2007 | Wang |
| 2009/0015142 A1 | 1/2009 | Potts |
| 2011/0064936 A1 | 3/2011 | Hammond-Cunningham |
| 2011/0157540 A1* | 6/2011 | Jung ............... H01L 51/5281 349/194 |
| 2013/0119416 A1* | 5/2013 | Yoneda ............... H01L 33/60 257/89 |
| 2013/0330505 A1 | 12/2013 | Park |
| 2015/0144890 A1 | 5/2015 | Ma |
| 2015/0357385 A1* | 12/2015 | Choi ............... H01L 51/5036 257/40 |
| 2016/0197311 A1 | 7/2016 | Lamansky |

OTHER PUBLICATIONS

International Search Report for PCT International Application No. PCT/US2017/049438, dated Dec. 28, 2017, 3 pages.

* cited by examiner

DISPLAY STACK INCLUDING EMISSIVE DISPLAY AND COLOR CORRECTION FILM

BACKGROUND

Emissive displays typically include discrete light emitting elements. These discrete light emitting elements often are capable of producing a combination of wavelengths so that the emissive display can produce or approximate a white appearance. These discrete light emitting elements may be organic light emitting diodes (OLEDs). Particularly for OLEDs, the white point produced on-axis (i.e., at normal incidence) may not be the same as the white point produced off-axis (e.g., at a 60 degrees viewing angle). This color shift may be significant enough to be noticeable or distracting. This color shift may also impair the viewability or readability of content by multiple people from the same device (as this necessarily requires a diversity of viewing angles).

SUMMARY

In one aspect, the present description relates to a display stack. The display stack includes an emissive display including a plurality of organic light emitting diodes, a circular polarizer, and a color correction film disposed between the emissive display and the circular polarizer. The color correction film includes a plurality of microlayers, each microlayer having a maximum difference among its three orthogonal refractive indices at 550 nm is less than or equal to 0.05, each microlayer having an average refractive index being the arithmetic average of the three orthogonal refractive indices at 550 nm. The plurality of microlayers are configured into microlayer pairs of alternating high and low index microlayers, and wherein the average refractive index of each high index microlayer is between 0.15 and 0.75 more than the average refractive index of each low index microlayer. The microlayer pairs each have optical thicknesses at 550 nm between 150 nm and 550 nm, and at least half of the microlayer pairs have optical thicknesses at 550 nm between 275 nm and 400 nm. The color correction film has few enough microlayers to transmit at least 80% of unpolarized visible light at normal incidence, photopically weighted. And the color correction film has enough microlayers to reflect at least 15% of at least one wavelength of unpolarized light at 60 degree incidence.

DETAILED DESCRIPTION

In some embodiments, display stacks including emissive displays may exhibit good (i.e., low) color shift with the use of a color correction film. In some embodiments, the color correction film provides a reflection or absorption spectrum that shifts with viewing angle. Spectra shifting with angle may allow for one or more characteristics of the color correction film—for example, the reflection or absorption fraction for light at a certain wavelength or the peak reflected or absorbed wavelength—to shift with angle. In some embodiments, the color correction film may have a non-existent, negligible, or only slight effect on the white point and other visual factors and its presence or absence, at least on axis, may be otherwise unnoticeable or very difficult to notice for an observer. In some embodiments, the color correction film can exhibit color correcting absorption or reflection properties on axis, compensating for at least some of any color shift from the emissive display as the viewing angle increases. Alternatively or additionally, in some embodiments, the color correction film can exhibit color correcting absorption or reflection properties off-axis, which may adjust the white point of the display stack. In some of these embodiments, the white point of the associated emissive display can be adjusted accordingly.

Figure 1:
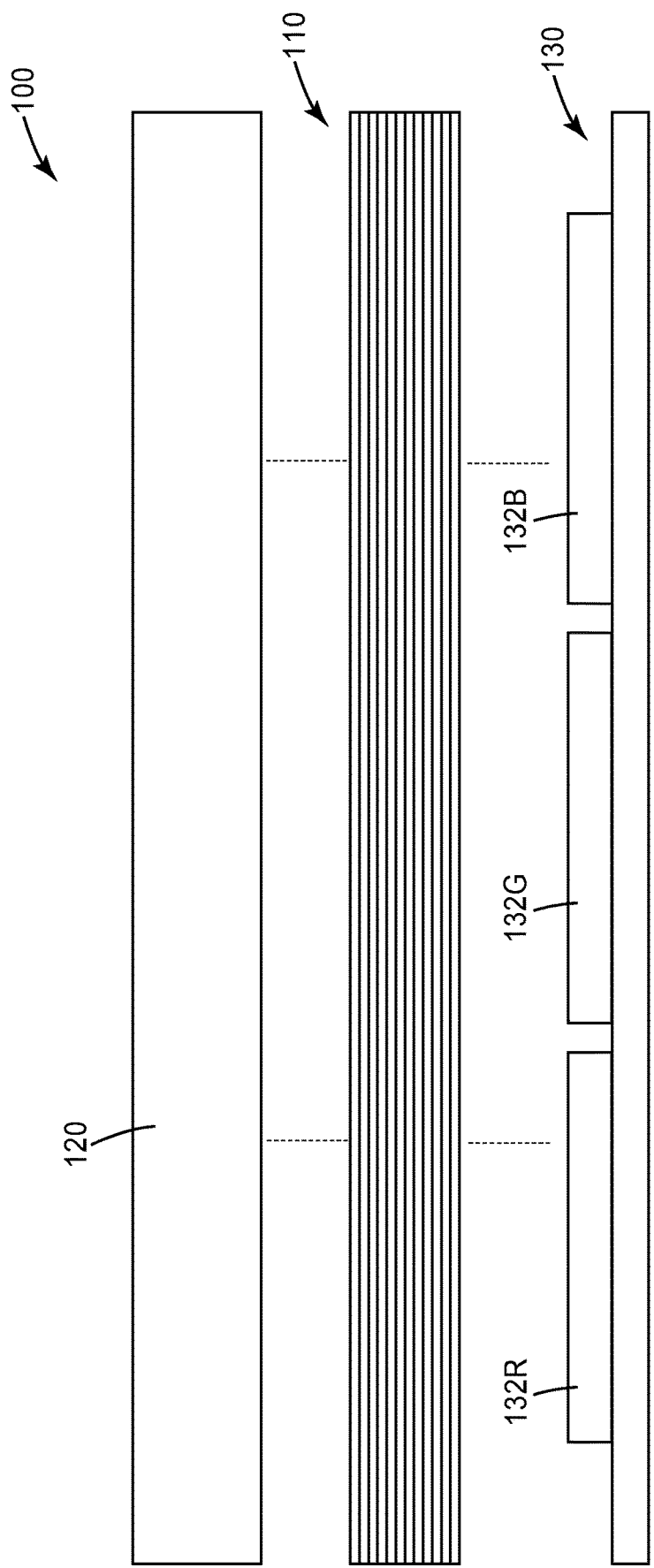
FIG. 1 is an exploded front elevation view of a display stack including an emissive display and a color correction film.

FIG. 1 is an exploded front elevation view of a display stack including an emissive display and a color correction film. Display stack 100 includes color correction film 110, circular polarizer 120, and emissive display 130 including organic light emitting diodes 132R, 132G, and 132B.

Emissive display 130 may include organic light emitting diodes corresponding to pixels or subpixels, indicated in FIG. 1 as 132R, 132G, and 132B. In some embodiments, and as indicated in FIG. 1 with the tags "R," "G," and "B," the organic light emitting diodes (OLEDs) may generate or emit light of different wavelengths (for example red, green, and blue, respectively). In some embodiments, the OLEDs may emit wavelengths selected to be capable of producing or approximating white light, or a certain white point designed or determined to be suitable for the particular device, display stack, or application. Although not illustrated in detail in FIG. 1, emissive display 130 should be understood to include any suitable driving electronics and other layers; for example, encapsulants including thin film encapsulants, reflective electrodes or other reflective backplanes or layers, optically clear adhesives, transparent or partially reflective electrodes, substrates including flexible substrates, and the like. Emissive displays described herein may be either top-emitting or bottom-emitting, and may be utilizing either a strong or weak optical cavity (depending on the degree of reflection within the organic layer stack from the reflectivity of the top and bottom electrodes). Further, although the OLEDs are illustrated and labeled as if they are emitting distinct wavelengths of light, other configurations are contemplated, such as color-by-white (where white light is emitted and passed through absorptive color filters corresponding to differently colored subpixels, as is typical in liquid crystal displays) or stacked OLEDs.

Circular polarizer 120 may be any suitable circular polarizer. Circular polarizer 120 is typically an absorbing type circular polarizer. In some embodiments, circular polarizer 120 absorbs one polarization handedness of light while transmitting the other. The circular polarizer is used to minimize distracting specular reflections off of the reflective metal electrodes of the emissive display. For ambient light, light of one polarization handedness is absorbed, and the transmitted light switches handedness if specularly reflected. Thus, the light having a previously transmitted polarization handedness is now a handedness that is absorbed. Therefore, a large portion of ambient light, in some embodiments approaching 100%, is absorbed (not viewed).

Color correction film 110 is illustrated as disposed between circular polarizer 120 and emissive display 130. In some embodiments, color correction film 110 is disposed on the opposite side of circular polarizer 120. In some embodiments, one or more of the components shown may be laminated, secured, or adhered to one another. These components may be attached with an adhesive, including a hot melt adhesive, a curable (including UV-curable) adhesive, an optically clear adhesive, a pressure sensitive adhesive, tape, or any other suitable bonding component. In some embodiments, the color correction film is formed on or deposited directly on the circular polarizer.

Color correction film 110 may be a multilayer film. In some embodiments, color correction film 110 includes substantially isotropic (not birefringent) microlayers. In some embodiments, color correction film 110 includes no birefringent microlayers. In some embodiments, color correction film 110 includes no oriented birefringent polymeric microlayers. Color correction films without birefringent microlayers may work better in display stacks that depend on careful polarization control for, for example, ambient glare reduction. Color correction film 110 is described in further detail in conjunction with FIG. 2.

In some embodiments, color correction film 110 is a multilayer interference reflector. These reflectors operate by reflecting light at interfaces between microlayers of different refractive index and precise thickness. At the interface of two microlayers of different indices of refraction, light that has twice the wavelength of the optical thickness (index of refraction times physical thickness) of the microlayer pair is reflected through constructive interference. Wavelengths surrounding this wavelength (twice the optical thickness) are reflected, but to a lesser extent. The f-ratio (the ratio between the optical thicknesses in each microlayer pair) may be about 0.5, or it may be changed in order to produce or suppress higher order reflection bands such as 0.1, 0.25, 0.75, 0.9, or any other ratio. In some embodiments the f-ratio may vary throughout the reflector. The intensity of the reflection bands depends on the magnitude of the index difference between the microlayers in each microlayer pair. Adding more microlayer pairs may increase the total reflected light; however, a large number of microlayer pairs (for example, more than 10) may significantly increase the difficulty for manufacturing. Surprisingly, however, very good color correction performance can be achieved with a modest and practical number of microlayer pairs. Further, the low microlayer count in these embodiments helps sustain high transmission through the color correction film (especially on-axis/at normal incidence), preserving low conspicuity and minimizing brightness loss for a viewer of the display stack on-axis.

Figure 2:
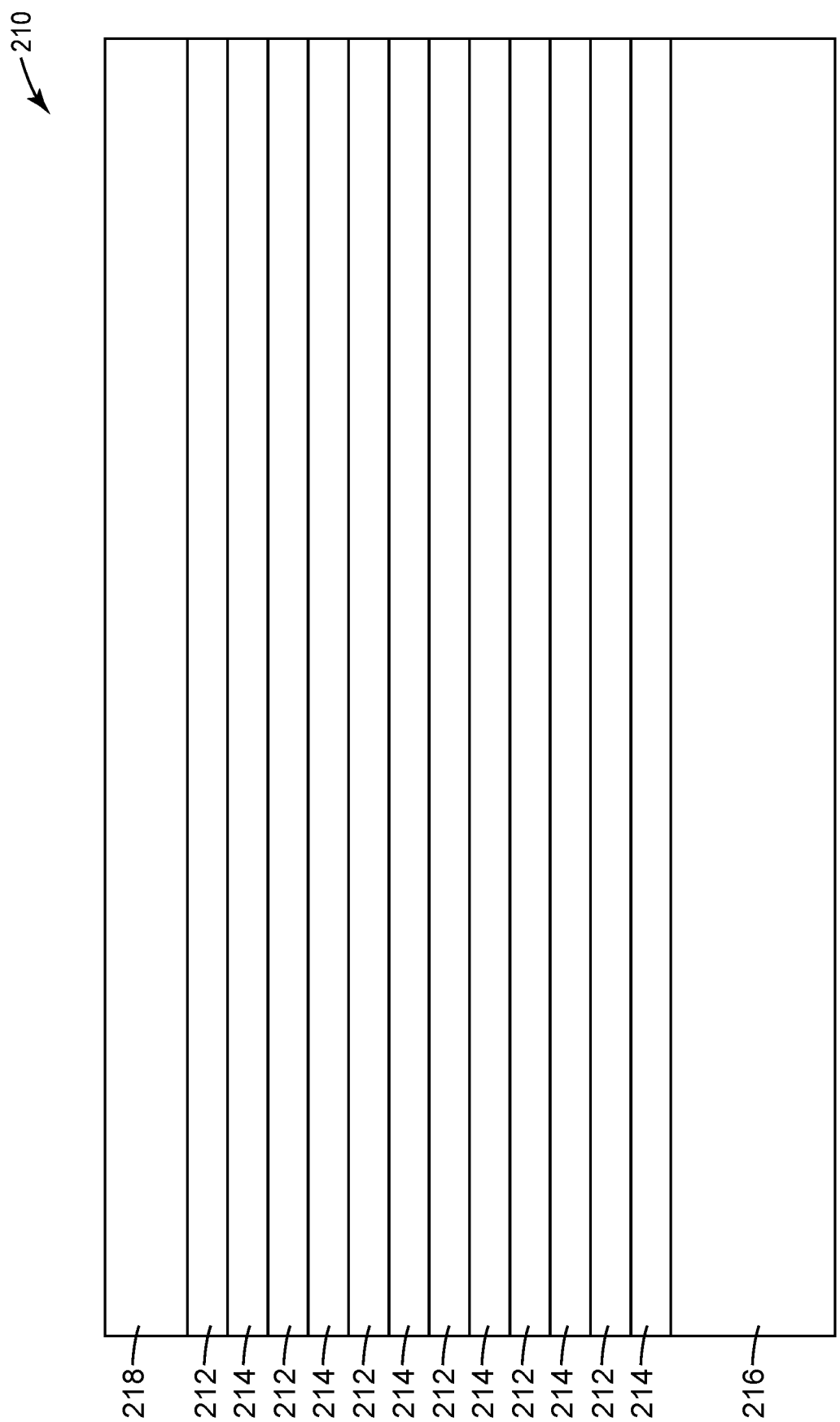
FIG. 2 is a front elevation cross-section of the color correction film of FIG. 1.

FIG. 2 is a front elevation cross-section of the color correction film of FIG. 1. Color correction film 210 includes alternating microlayers of high index microlayer 212 and low index microlayer 214, substrate 216, and protective film 218.

Alternating microlayers of high index microlayer 212 and low index microlayer 214 may be any suitable thickness and may be formed of any suitable material that provides a suitable index of refraction contrast. In some embodiments, the average refractive index (the arithmetic average of each of the three orthogonal indices of refraction at 550 nm) of each high index microlayer is between 0.25 and 0.5 more than the average refractive index of each low index microlayer. In some embodiments, one or both of high index microlayer 212 and low index microlayer 214 may include at least one "bi-layer;" for example, a bi-layer of a metal oxide and a polymer. In some embodiments, zirconia may be used as a high-index metal oxide and silica may be used as a lower-index metal oxide. Methods to approximate desired thickness with precision within tens of nanometers exist, whereby depositing a plurality of bilayers the desired thickness can be reached. An exemplary process is described in the Examples. In some embodiments, high and low index microlayers are isotropic. In some embodiments, high and low index microlayers each have a maximum difference between their orthogonal indices of refraction at 550 nm of 0.05.

The target design for the color correction film includes the thickness and refractive index of each microlayer. Generally, the refractive indices of the high index microlayers and the low index microlayers are fixed to match values that can be readily obtained by the coating fabrication methods (i.e., layer-by-layer coating or vacuum deposition). Since the target design for the color correction film depends strongly on the particular characteristics of the given OLED device, the determination of the optimal multilayer must begin with a careful measurement of the OLED device white point spectra as a function of viewing angle (e.g. at 0, 30, 60 degrees from normal). A multi-layer optical model for the color correction film may, then, be constructed in mathematical software such as MATLAB software from Mathworks (Natick, Mass.) using commonly known means for N layer alternating index structures. A figure of merit for color variation can then be composed as the summation of color variation across all the measured viewing angles. The design parameters of the multi-layer model film may then be optimized so that the figure or merit for color variation is minimized. The commercial software package ISIGHT from Dassault Systèmes (Vélizy-Villacoublay, France) is useful for this optimization. The resulting optimized multi-layer optical stack is matched to the particular characteristics of the OLED device to minimize the metric for color variation across the range of measured view angles.

Layer-by-layer coatings, also known as polyelectrolyte multilayer (PEM) coatings or electrostatically self-assembled (ESA) coatings, are one class of coatings that can be used for the color correction film. The plurality of microlayers disposed on the substrate comprise at least one "bi-layer" deposited by what is commonly referred to as a "layer-by-layer self-assembly process". This process is commonly used to assemble thin films or coatings of oppositely charged polyions such as polyelectrolytes and/or inorganic oxide particles electrostatically, but other functionalities such as hydrogen bond donor/acceptors, metal ions/ligands, and covalent bonding moieties can be the driving force for film assembly. Typically, this deposition process involves exposing the substrate having a surface charge, to a series of liquid solutions, or baths. This can be accomplished by immersion of the substrate into liquid baths (also referred to as dip coating), spraying, spin coating, roll coating, inkjet printing, and the like. Exposure to the first polyion (e.g., polyelectrolyte bath) liquid solution, which has charge opposite that of the substrate, results in charged species near the substrate surface adsorbing quickly. This establishes a concentration gradient and draws more polyelectrolyte from the bulk solution to the surface. Further adsorption occurs until a sufficient microlayer has developed to mask the underlying charge and reverse the net charge of the substrate surface. In order for mass transfer and adsorption to occur, this exposure time is typically on the order of seconds to minutes. The substrate is then removed from the first polyion (e.g., bath) liquid solution, and is then exposed to a series of water rinse baths to remove any physically entangled or loosely bound polyelectrolyte. Following these rinse (e.g., bath) liquid solutions, the substrate is then exposed to a second polyion (e.g., polyelectrolyte or inorganic oxide nanoparticle bath) liquid solution, which has charge opposite that of the first polyion (e.g., bath) liquid solution. Once again adsorption occurs, since the surface charge of the substrate is opposite that of the second (e.g., bath) liquid solution. Continued exposure to the second polyion (e.g., bath) liquid solution then results in a reversal of the surface charge of the substrate. A subsequent rinsing can be performed to complete the cycle. This sequence of steps is said to build up one "bi-layer" of deposition and can be repeated as desired to add further bi-layers to the substrate. Multiple bi-layers are typically deposited to form one microlayer.

Some examples of suitable processes include those described in U.S. Pat. No. 8,234,998 (Krogman et al.); U.S. Pre-Grant Publication No. 2011/0064936 (Hammond-Cunningham et al.); and U.S. Pat. No. 8,313,798 (Nogueira et al.). Commercially available equipment for carrying out the layer-by-layer coating process include the STRATOSEQUENCE VI (nanoStrata Inc., Tallahassee, Fla.) dip coating robot and the SPALAS (Spray-Assisted Layer-by-Layer Assembly) coating system available from Agiltron, Inc. (Woburn, Mass.).

Thickness of layer-by-layer coatings on a substrate can be determined by common methods known in the art including, for example, stylus profilometry. Thickness and refractive index of layer-by-layer coatings can be determined by common methods known in the art including, for example, spectroscopic ellipsometry or reflectometry. Many layer-by-layer coatings exhibit a linear increase in thickness with the number of deposited bi-layers, while others exhibit exponential or super-linear growth. So-called "growth curves" (i.e., plots of thickness vs. number of bi-layers) are generally made for a given layer-by-layer material set (i.e., a polycation and a polyanion pair) under a specific set of conditions (e.g., concentration of the polyelectrolytes, ionic strength in the coating solutions, and pH of the coating solutions). For low index microlayers, the material set typically comprises a polymeric polycation (e.g., polydiallyldimethylammonium chloride) and a low refractive index, anionic inorganic oxide nanoparticle (e.g., colloidal silicon dioxide). For high refractive index microlayers, the material set typically comprises a polymeric polycation and a high refractive, anionic index inorganic oxide nanoparticles (e.g., colloidal zirconia or colloidal titania).

Inorganic silica sols in aqueous media are well known in the art and available commercially. Silica sols in water or water-alcohol solutions are available commercially under such trade names as LUDOX (manufactured by E.I. duPont de Nemours and Co., Inc., Wilmington, Del.), NYACOL (available from Nyacol Co., Ashland, Mass.) or NALCO (manufactured by Nalco Chemical Co., Naperville, Ill.). Some useful silica sols are NALCO 1115, 2326, 1050, 2327, and 2329 available as silica sols with mean particle sizes of 4 nanometers (nm) to 77 nm. Another useful silica sol is NALCO 1034a available as a silica sol with mean particle size of 20 nanometers. A useful silica sol is NALCO 2326 available as a silica sol with mean particle size of 5 nanometers. Additional examples of suitable colloidal silicas are described in U.S. Pat. No. 5,126,394 (Revis et al.).

Various high refractive index inorganic oxide sols are commercially available. Zirconia sols are available from Nalco Chemical Co. (Naperville, Ill.) under the trade designation "Nalco 00SS008", Buhler AG (Uzwil, Switzerland) under the trade designation "Buhler zirconia Z—WO sol" and Nissan Chemical America Corporation (Houston, Tex.) under the trade name "NANOUSE ZR". A nanoparticle dispersion that comprises a mixture of tin oxide and zirconia covered by antimony oxide (RI ~1.9) is commercially available from Nissan Chemical America Corporation (Houston, Tex.) under the trade designation "FIX-05M5". A tin oxide nanoparticle dispersion (RI ~2.0) is commercially available from Nissan Chemicals Corp. under the trade designation "CX-S501M".

In some embodiments, the inorganic oxide nanoparticles comprise titania. Various forms of titania can be utilized including anatase, brookite, rutile and amorphous forms. Anatase titania nanoparticle (5-15 nm diameter) dispersions are commercially available from U.S. Research Nanomaterials (Houston, Tex.) as an aqueous suspension at 15 wt %. $TiO_2$ sols are also available dispersed in an acidic or basic solution from Ishihara Sangyo Kaisha Ltd. (Osaka, Japan). Titania has an isoelectric point at about pH 4-6 and thus can be used as a polyanion in layer-by-layer self-assembly at pH sufficiently above the isoelectric point, or the polycation in layer-by-layer self-assembly at pH sufficiently below the isoelectric point.

Suitable polyelectrolytes include polycationic polymers (i.e., polycations), such as polyallylamines or polyethylenimines. Suitable polycationic polymers include, for instance and without limitation, linear and branched poly(ethylenimine), poly(allylamine hydrochloride), polyvinylamine, chitosan, polyaniline, polyamidoamine, poly(vinylbenzyltrimethylamine), poly(diallyl-dimethyl ammonium chloride), poly(dimethylaminoethyl methacrylate), and poly(methacryloylamino)propyl-trimethylammonium chloride. Suitable polyanionic polymers include, but are not limited to, poly(vinyl sulfate), poly(vinyl sulfonate), poly(acrylic acid), poly(methacrylic acid), poly(styrene sulfonate), dextran sulfate, heparin, hyaluronic acid, carrageenan, carboxymethylcellulose, alginate, sulfonated tetrafluoroethylene based fluoropolymers such as NAFION, poly(vinylphosphoric acid), and poly(vinylphosphonic acid).

To match a target design for a color correction film, growth curves are made for the high refractive index and low refractive index material sets typically on a glass substrate; other substrates such as silicon wafers or polymer film are also applicable. The growth curves allow for determination of the number of bi-layers required to reach a desired thickness. Color correction coatings are then fabricated with the requisite number of bi-layers for each material set, and the UV/Vis/NIR reflection and/or transmission spectra are measured with a spectrophotometer. The spectra are then compared to the theoretical spectrum for the target design. If the spectra are not sufficiently close, then different numbers of bi-layers are deposited until the spectra are more closely matched. The actual thickness of the high and low index microlayers can be determined, for example, using cross-sectional scanning or transmission electron microscopy. Alternatively, optical modeling software can be used to determine the actual thickness of the microlayers. Often, non-idealities exist, such as different rates of coating growth affected by the substrate. Thus, the number of bi-layers may need to be altered accordingly to more closely match an optical design.

Vacuum deposited thin films are another class of coatings that may be used for the color correction film. The alternating microlayers of high index microlayer 212 and low index microlayer 214 may be may be fabricated by conventional thin film vacuum deposition techniques for either polymer thin films, inorganic thin films or in hybrid combination of polymer and inorganic layers as described in U.S. Pat. No. 7,018,713 (Padiyath et al.). Depending on the type of polymer material, the films can be vapor deposited with different strategies. Direct vapor deposition can be applied for such polymers as polyethylene or polytetrafluoroethylene that have weak intermolecular interaction. In general, polymer thin films are obtained by a vapor-deposition polymerization method, which evaporates monomer materials and produces polymer thin films by polymerization reaction on the substrate surface. Co-evaporation of bifunctional monomers leads to stepwise reaction via polycondensation or polyaddition to obtain thin films of such polymers as polyimide and polyurea. This method can also be applied for preparing thin films of π-conjugated polymers. Another class of vapor-deposition polymerization utilizes chain-addition reaction to achieve radical polymerization of vinyl or acrylic monomers. This method has advantages in obtaining higher degrees of polymerization and in enabling versatile molecular design. A surface-initiated vapor-deposition polymerization, which combines the self-assembled monolayer (SAM) with vapor deposition of monomers, is a unique method to grow polymer thin films that are chemically bound to the substrate surface. The solvent-free nature of PVD is convenient for the formation of nanometer-thick films and multilayer films that are sometimes required for device fabrication.

Alternating microlayers of high index microlayer 212 and low index microlayer 214 may have a thickness that varies within the color correction film. In some embodiments, the microlayers may be configured roughly from thinnest to thickest optical layer pair thickness (for example, with no more than two layer pair exceptions), or vice versa. In some embodiments, each layer pair optical thickness is different. In some embodiments, each layer optical thickness is the same. In some embodiments, with so few layers, it is necessary to maximize the breadth of reflected wavelengths by having each layer pair covering a different portion of the desired reflection band. In some embodiments, however, with so few layers, it is necessary to maximize the intensity of a certain reflected wavelength by having more than one layer pair for a given wavelength or having more than one layer pair within 10 nm of each other. In some embodiments, each of the layer pairs each have optical thicknesses at 550 nm between 150 nm and 550 nm. In some embodiments, at least half of the layer pairs have optical thicknesses at 550 nm between 275 and 400 nm. In some embodiments, at least half the layer pairs have optical thicknesses that correspond to a reflection band centered on yellow, orange, or red light. The exact tuning and configuration of the layer thicknesses will depend on the configuration on the rest of the display and the particularities of the emissive display's white point.

Because the color correction film enhances color fidelity with shifting angle based on reflection or absorption, there is a necessary tradeoff between the magnitude of those properties and transmission. In some embodiments, it may be desirable to keep the transmission high. In some embodiments, the color correction film has few enough layers to transmit at least 80% of unpolarized visible light at normal incidence. In some embodiments, the color correction film has few enough layers to transmit at least 85% of unpolarized visible light at normal incidence. In some embodiments, the color correction film has few enough layers to transmit at least 90% of unpolarized visible light at normal incidence. The percentage of transmission should be the photopically weighted transmission average. Conversely, in some embodiments, in order to be effective at correcting color shift, the reflection or absorption of at least one wavelength of unpolarized light at 60 degree incidence should be at least 10%. In some embodiments, the reflection or absorption of at least one wavelength of unpolarized light at 60 degree incidence should be at least 15%. In some embodiments, the reflection or absorption of at least one wavelength of unpolarized light at 60% incidence should be at least 20%. In some embodiments, the color correction film has between 6 and 26 optical layers, inclusive.

In some embodiments, the color correction film includes substrate 216. The substrate may provide dimensional stability to the color correction film, can serve as a protective or carrier layers, or can provide good adhesion to another display surface or component. The substrate may be any suitable material and may have any suitable dimensions, including any suitable thickness, stiffness, and modulus. In some embodiments, the substrate is necessary for certain processes of forming the color correction film. For example, certain processes require deposition of thin layers on a surface, and the substrate may have the layers deposited thereon. In some embodiments, the substrate may be a polymeric material, such as polyethylene terephthalate (PET), polycarbonate (PC), cyclic olefin copolymer (COC), or poly(methyl methacrylate) (PMMA). In some embodiments, it may be preferable to use a substrate with low inherent birefringence, for the same reason as it may be preferable to avoid birefringent microlayers in rest of the color correction film. In some embodiments, the substrate may have other optical functions or properties; for example, the substrate may be a circular polarizer.

Protective film 218 may be any suitable protective film or layer and may protect the microlayers from damage or abrasion. In some embodiments, the protective film may be or include a hardcoat. In some embodiments, the protective film may include antireflection features. In some embodiments, the protective film may include antiglare features. In some embodiments, the protective film may include combinations of these features. Protective film 218 is optional and may be omitted in some embodiments.

Color correction film 210 may, in some embodiments, appear cyan in transmission at normal incidence. In some embodiments, the color correction film may appear magenta in transmission at 60 degrees incidence. Display stacks including color correction films described herein may exhibit good color shift performance, characterized by any suitable method. For example, when the emissive display is fully on, the display stack may exhibit a color shift between normal incidence and 60 degrees incidence of less than 2 just noticeable differences (2 JND). A just noticeable difference, for purposes of this description is, in an L*a*b* color space, the Euclidian distance between the two points in a*b* coordinates (the display stack viewed at normal incidence and 60 degrees incidence), divided by 2.3. In some embodiments, the display stack may exhibit a color shift between normal incidence and 60 degrees incidence of less than 1.5 JND. In some embodiments, the display stack may exhibit a color shift between normal incidence and 60 degrees incidence of between 0.5 and 1.5 JND. In some embodiments, the display stack may exhibit a color shift between normal incidence and 60 degrees incidence along a* of less than 2. In some embodiments, the display stack may exhibit a color shift between normal incidence and 60 degrees incidence along b* of less than 6.

EXAMPLES

As mentioned previously, the exact tuning and configuration of the layer thicknesses will depend on the configuration on the rest of the display and the particularities of the emissive display's white point. Various methods are suitable means to form the alternating high index and low index microlayers to precise thickness targets for the optimal color correction film for each display. The particular thickness and optical index are exemplary for this particular display, but are not restrictive in making optimal color correction films designed to accommodate characteristics of another display.

In the examples that follow, two processes are described in detail to provide samples of particular layer thicknesses and optical index which are suitable for a particular display condition. The first process describes a Layer-By-Layer self-assembled coating method (hereafter abbreviated as LBL) and the second process describes Vacuum Thin Film coating method (hereafter abbreviated as VTF).

Test Methods

Method for Measuring Color of an OLED Display

Color measurements were made with a Westar Display Technologies, Inc. (St. Charles, Mo.) FPM-520 instrument.

Method for Measuring pH

The pH of the solutions used for LBL coating was determined using a VWR SYMPHONY rugged bulb pH electrode connected to a VWR SYMPHONY pH meter. Standard buffer solutions were used for calibration.

Method for Making Layer-by-Layer (LBL) Self-Assembled Coatings

Materials

Unless otherwise noted, all parts, percentages, ratios, etc., in the examples and in the remainder of the specification are by weight. Unless otherwise noted, all chemicals were obtained from, or are available from, chemical suppliers such as Sigma-Aldrich Co., St. Louis, Mo.

The following is a list of materials used throughout the LBL Examples:

"PDAC" refers to poly(diallyl-dimethyl ammonium chloride), a positively charged polymer with molecular weight 100-200K, obtained as a 20 wt % solution in water from Sigma-Aldrich Co. (St. Louis, Mo.).

"$SiO_2$", unless otherwise specified, refers to silica nanoparticles (20 nm diameter, ammonium stabilized), obtained from Nalco Co. (Naperville, Ill.) as a 40 wt % aqueous dispersion under the trade designation "Nalco 2327".

"$ZrO_2$" unless otherwise specified, refers to zirconia nanoparticles (6-15 nm diameter, tetraethylammonium hydroxide/organic acid stabilized) obtained from Nissan Chemical America Corporation (Houston, Tex.) as a 30.5 wt % aqueous dispersion under the trade designation "NanoUse ZR-30BFN".

"TMACl" refers to tetramethylammonium chloride obtained from SACHEM, Inc. (Austin, Tex.) as a 50% solution in water.

"TMAOH" refers to tetramethylammonium hydroxide obtained from Alfa Aesar (Ward Hill, Mass.) as a 2.38 wt % solution in water.

Method

Layer-by-layer self-assembled coatings were made using an apparatus purchased from Svaya Nanotechnologies, Inc. (Sunnyvale, Calif.) and modeled after the system described in U.S. Pat. No. 8,234,998 (Krogman et al.) as well as Krogman et al. *Automated Process for Improved Uniformity and Versatility of Layer-by-Layer Deposition, Langmuir* 2007, 23, 3137-3141.

The apparatus comprises pressure vessels loaded with the coating solutions. Spray nozzles with a flat spray pattern (from Spraying Systems, Inc., Wheaton, Ill.) are mounted to spray the coating solutions and rinse water at specified times, controlled by solenoid valves. The pressure vessels (Alloy Products Corp., Waukesha, Wis.) containing the coating solutions are pressurized with nitrogen to 30 psi, while the pressure vessel containing de-ionized (DI) water is pressurized with air to 30 psi. Flow rates from the coating solution nozzles are each about 10 gallons per hour, while flow rate from the DI water rinse nozzles is about 40 gallons per hour. The substrate to be coated was adhered with epoxy (Scotch-Weld epoxy adhesive, DP100 Clear, 3M Company, St. Paul, Minn.) to a glass plate (12"×12"×⅛" thick) (Brin Northwestern Glass Co., Minneapolis, Minn.), which is mounted on a vertical translation stage and held in place with a vacuum chuck. In a typical coating sequence, the polycation (e.g. PDAC) solution is sprayed onto the substrate while the stage moves vertically downward at 76 mm/sec. Next, after a dwell time of 12 sec, the DI water solution is sprayed onto the substrate while the stage moves vertically upward at 102 mm/sec. Next, after a dwell time of 4 sec, the polyanion (e.g. $SiO_2$ or $ZrO_2$ nanoparticles) solution is sprayed onto the substrate while the stage moves vertically downward at 76 mm/sec. Another dwell period of 12 sec is allowed to elapse. Finally, the DI water solution is sprayed onto the substrate while the stage moves vertically upward at 102 mm/sec, and a dwell period of 4 sec is allowed to elapse. The above sequence is repeated to deposit a desired number of "bi-layers". The coating is then dried with a stream of compressed air. These bi-layers make up one optical microlayer. When $ZrO_2$ nanoparticles are used as the polyanion, the microlayer is denoted as a high refractive index layer. When $SiO_2$ nanoparticles are used as the polyanion, the microlayer is denoted as a low refractive index optical layer.

Methods for Making Multilayer Vacuum Thin Film (VTF) Microlayers

In general, vacuum thin film deposition techniques of various types are commonly described. These include, for example, various forms of evaporation, sputtering and chemical vapor deposition techniques which may possess differing advantages for coating differing types of continuous or batch manufacturing processes. Without limitation, the vacuum deposition method used for this disclosure describes two means commonly known as electron beam (e-beam) evaporation and sputtering.

a. E-Beam Deposition

Materials: High Index (Hn) Material refers to metal oxide evaporation materials with visible wavelength refractive index >~1.9 and including materials such as titanium oxides, zirconium oxides, niobium oxides, zinc oxides, tantalum oxides and the like.

Low Index (Ln) Material refers to metal oxide evaporation materials with visible wavelength refractive index <~1.5 and including materials such as silicon oxides, magnesium fluorides, calcium fluorides and the like.

Method: The apparatus is a vacuum coating chamber equipped with (1) a four hearth electron-beam evaporation source, (2) rotating planetary fixtures, (3) vacuum pumping station and (4) quartz crystal microbalance (QCM) and (5) spectral optical thickness monitor. This method is particularly suitable and in widespread use for coating discrete substrates such as glass filters, ophthalmic lenses and similarly shaped or rigid objects and is commonly known in the vacuum thin film industry.

Prior to coating, two of the evaporation source hearths are pre-filled with granules of Hn material and the other two evaporation source hearths are pre-filled with granules of Ln material.

The substrates which are to be coated are fastened to the underside of the rotating planetary fixture(s) and the vacuum coating chamber is pumped to an appropriate process pressure for evaporation, generally <$10^{-5}$ Torr.

Using an electron beam source and deposition controller, the individual layers of the optical design are coated sequentially, one layer at a time as the multi-layer design requires. For example, beginning with layer 1 (e.g. $TiO_2$ material of Example 3) the high voltage electron beam current is increased to a pre-programmed setting, thus heating the $TiO_2$ granules to vaporization temperature. Upon vaporization, the QCM (shuttered to "see" the evaporated flux)

begins to be coated, causing a mass and (thus) resonant frequency change. Using material constants in calculation, the mass and frequency changes are converted to steady state evaporation rate and accumulating thickness. The deposition controller adjusts electron beam power to a pre-determined rate setting and, upon reaching steady state, the source to substrate shutter is opened, allowing substrates mounted upon the rotating planetary fixtures to begin being coated. During deposition the spectral optical thickness monitor also "sees" the accumulating coating. Upon reaching the set point of the layer optical thickness, the source to substrate shutter is closed and electron beam current is reduced to zero. Next, the evaporation hearth for layer 2—in the case of Example 3, the Ln (1.46) material, $SiO_2$—is sequenced into position and a similar heating to vaporization, shutter opening, coating, and termination sequence is carried out with alternating layers of $TiO_2$ (Hn material with index of refraction of 2.23)

b. Vacuum Sputtering

Materials: High Index (Hn) Material refers to metal oxide sputtering materials with visible wavelength refractive index >~1.9 and including materials such as titanium oxides, zirconium oxides, niobium oxides, zinc oxides, indium oxides, zinc tin oxides and the like.

Low Index (Ln) Material refers to metal oxide sputtering materials with visible wavelength refractive index <~1.5 and including materials such as silicon oxides and the like. In certain cases polymer layers, such as acrylates, can be deposited by a hybrid deposition method and substituted for the sputtered Ln metal oxide material. These polymer layers can provide equivalent optical performance, but also "chemical tuning" of physical properties affecting intrinsic stress and adhesion, for example.

Method: Unlike the approach of electron beam deposition when coating upon discrete substrates (i.e. one layer at a time), deposition techniques such as sputtering can be used to great efficiency when coating film substrates in continuous processes. In the illustration below, eleven deposition sources—six for Fin and five for Ln materials—are positioned around the circumference of a temperature-controlled coating drum. Transparent film, such as PET or polyethylene naphthalate (PEN) or similar types, is wound over the surface passing by, in this illustration, the eleven coating sources and the entire eleven layer thin film stack is coated in a single machine pass. In cases where chamber size or cost of installing a high number of deposition sources is limited, a smaller number in similar arrangement may be used and the eleven layer coating can be completed in two or— depending upon the arrangement—more machine passes.

Similar to the electron beam evaporation sequence, spectral optical thickness monitoring is employed to monitor the accumulating coating, layer by layer, and coating algorithms are used to adjust individual layers thickness and, as needed, even optical properties, providing greater flexibility in tuning the thin film stack to optimal performance in a high efficiency coating scenario.

Example 1 Preparation

Layer-by-Layer (LBL) Coating Solutions

The PDAC coating solution was prepared by dispensing 17683 grams of de-ionized water, 25.71 grams of TMAOH (2.38%), and 290.88 grams of PDAC (20 wt %) into a plastic jug. The final concentration of PDAC is 20 mM with respect to the repeat unit. The pH of the solution was approximately 10.0. The solution was used immediately after preparation.

The $SiO_2$ nanoparticle coating suspension was prepared by dispensing 7511 grams of de-ionized water, 81.87 grams of TMACl (50%), 214.80 grams of TMAOH (2.38%), and 192.00 grams of $SiO_2$ (Nalco 2327) into a plastic jug. The final concentration of $SiO_2$ is 0.96 wt % and the final concentration of TMACl is 48 mM. The pH of the solution was approximately 11.5. The solution was aged overnight before use.

The $ZrO_2$ nanoparticle coating suspension was prepared by dispensing 7923 grams of de-ionized water, 51.20 grams of TMAOH (2.38%), and 26.23 grams of $ZrO_2$ (Nissan NanoUse ZR30-BFN) into a plastic jug. The final concentration of $ZrO_2$ is 0.10 wt %. The pH of the solution was approximately 10.0. The solution was used immediately after preparation.

LBL Coating on PET

Using the "Method for Making Layer-by-Layer (LBL) Self-Assembled Coatings" above, a coating with 10 optical microlayers was made on a PET substrate. The substrate was Skyrol SH41 (SKC Inc., Covington, Ga.), a 4 mil thick, primed polyester. The table below specifies the components and number of bi-layers in each microlayer. The high refractive index microlayers (odd numbered layers) comprise PDAC polymer and $ZrO_2$ nanoparticles. The low refractive index microlayers (even numbered layers) comprise PDAC polymer and $SiO_2$ nanoparticles. Layer #1 was the first stack deposited on the substrate.

TABLE 1

Multi-layer coating stack design for Example 1 using LBL

| Layer # | Polycation | Polyanion | # bi-layers | Target Thickness [nm] | Target Refractive Index at 550 nm |
|---|---|---|---|---|---|
| 1 | PDAC | $ZrO_2$ | 10 | 19.1 | 1.540 |
| 2 | PDAC | $SiO_2$ | 8 | 143.8 | 1.280 |
| 3 | PDAC | $ZrO_2$ | 8 | 26.7 | 1.540 |
| 4 | PDAC | $SiO_2$ | 11 | 201.3 | 1.280 |
| 5 | PDAC | $ZrO_2$ | 10 | 33.9 | 1.540 |
| 6 | PDAC | $SiO_2$ | 14 | 255.5 | 1.280 |
| 7 | PDAC | $ZrO_2$ | 7 | 26.5 | 1.540 |
| 8 | PDAC | $SiO_2$ | 11 | 199.8 | 1.280 |
| 9 | PDAC | $ZrO_2$ | 12 | 46.1 | 1.540 |
| 10 | PDAC | $SiO_2$ | 18 | 347.7 | 1.280 |

Example 2 Preparation

Layer-by-Layer (LBL) Coating Solutions

Coating solutions for Example 2 were prepared as described for Example 1.

LBL Coating on PET

Using the "Method for Making Layer-by-Layer (LBL) Self-Assembled Coatings" above, a coating with 10 optical microlayers was made on a PET substrate. The substrate was Skyrol SH41 (SKC Inc., Covington, Ga.), a 4 mil thick, primed polyester. The table below specifies the components and number of bi-layers in each microlayer. The high refractive index microlayers (odd numbered layers) comprise PDAC polymer and $ZrO_2$ nanoparticles. The low refractive index microlayers (even numbered layers) comprise PDAC polymer and $SiO_2$ nanoparticles. Layer #1 was the first stack deposited on the substrate.

TABLE 2

Multi-layer coating stack design for Example 2 using LBL

| Layer # | Polycation | Polyanion | # bi-layers | Target Thickness [nm] | Target Refractive Index at 550 nm |
|---|---|---|---|---|---|
| 1 | PDAC | $ZrO_2$ | 10 | 19.1 | 1.540 |
| 2 | PDAC | $SiO_2$ | 7 | 143.8 | 1.280 |
| 3 | PDAC | $ZrO_2$ | 8 | 26.7 | 1.540 |
| 4 | PDAC | $SiO_2$ | 10 | 201.3 | 1.280 |
| 5 | PDAC | $ZrO_2$ | 10 | 33.9 | 1.540 |
| 6 | PDAC | $SiO_2$ | 12 | 255.5 | 1.280 |
| 7 | PDAC | $ZrO_2$ | 7 | 26.5 | 1.540 |
| 8 | PDAC | $SiO_2$ | 10 | 199.8 | 1.280 |
| 9 | PDAC | $ZrO_2$ | 12 | 46.1 | 1.540 |
| 10 | PDAC | $SiO_2$ | 17 | 347.7 | 1.280 |

Example 3 Preparation

Example 3 was prepared using the e-beam Vacuum Thin Film (VTF) method as described in "Methods for making Multilayer Vacuum Thin Film (VTF) Microlayers" under "a. E-beam deposition" section above. For this example, the multilayer consists of an eleven layer design, then, the sequence is continued to completion on either PET or glass substrate with 0.002" to 0.100" thickness typical. For this example we used 125 micrometer thick PET.

TABLE 3

Multi-layer coating stack design for Example 3 using (VTF) E-beam

| Layer | Material | Thickness [nm] | Target Refractive Index at 550 nm |
|---|---|---|---|
| 1 | $TiO_2$ | 60.3 | 2.23 |
| 2 | $SiO_2$ | 96.9 | 1.46 |
| 3 | $TiO_2$ | 63.2 | 2.23 |
| 4 | $SiO_2$ | 127.8 | 1.46 |
| 5 | $TiO_2$ | 60.5 | 2.23 |
| 6 | $SiO_2$ | 118.9 | 1.46 |
| 7 | $TiO_2$ | 57.6 | 2.23 |
| 8 | $SiO_2$ | 138.4 | 1.46 |
| 9 | $TiO_2$ | 60.2 | 2.23 |
| 10 | $SiO_2$ | 120.1 | 1.46 |
| 11 | $TiO_2$ | 30.8 | 2.23 |

Comparative Example 1: Uncoated PET Laminated to OLED Display

The same PET substrate used in Example 1, except without any applied coating.

Test Samples and Results:

For each Example 1-3 the coated substrate was laminated by hand to the front surface of a Samsung Galaxy S3 with 3M Optically Clear Adhesive (OCA) (Product #8146-3). (For Comparative Example 1, the uncoated PET sample was likewise laminated.) A 3M Natural View Screen Protector film was laminated to the PET. Color measurements were made according to the "Method for Measuring Color of an OLED Display" described above.

TABLE 4

Color data for Example 1

| Angle | L/Cd/m² | u' | v' | x | y | CCTK | X | Y | Z | a* | b* | dE | JND |
|---|---|---|---|---|---|---|---|---|---|---|---|---|---|
| 0° | 409.3 | 0.185 | 0.464 | 0.293 | 0.326 | 7716 | 367.4 | 409.3 | 478.5 | 0 | 0 | 0 | 0 |
| 30° | 315.8 | 0.186 | 0.459 | 0.291 | 0.318 | 7995 | 288.4 | 315.8 | 387.5 | 2.68 | −2.99 | 4.02 | 1.75 |
| 60° | 112.7 | 0.183 | 0.462 | 0.289 | 0.323 | 8017 | 100.8 | 112.7 | 135.3 | −0.40 | −1.15 | 1.21 | 0.53 |

TABLE 5

Color data for Example 2

| Angle | L/Cd/m² | u' | v' | x | y | CCTK | X | Y | Z | a* | b* | dE | JND |
|---|---|---|---|---|---|---|---|---|---|---|---|---|---|
| 0° | 373.6 | 0.201 | 0.449 | 0.301 | 0.299 | 7709 | 376.2 | 373.6 | 501.1 | 0 | 0 | 0 | 0 |
| 30° | 306.0 | 0.199 | 0.447 | 0.297 | 0.296 | 8098 | 307.0 | 306.0 | 421.0 | −0.59 | −1.60 | 1.70 | 0.74 |
| 60° | 116.7 | 0.179 | 0.464 | 0.285 | 0.329 | 8133 | 101.2 | 116.7 | 136.9 | −16.4 | 5.92 | 17.5 | 7.59 |

TABLE 6

Color data for Example 3

| Angle | L/Cd/m² | u' | v' | x | y | CCTK | X | Y | Z | a* | b* | dE | JND |
|---|---|---|---|---|---|---|---|---|---|---|---|---|---|
| 0° | 425.7 | 0.189 | 0.459 | 0.293 | 0.317 | 7861 | 394.2 | 425.7 | 524.2 | 0.00 | 0.00 | 0.00 | 0.00 |
| 30° | 338.0 | 0.183 | 0.451 | 0.280 | 0.307 | 9177 | 308.8 | 338.0 | 455.3 | −2.10 | −5.62 | 6.01 | 2.61 |
| 60° | 112.7 | 0.184 | 0.456 | 0.285 | 0.314 | 8546 | 102.3 | 112.7 | 144.1 | −2.16 | −1.60 | 2.68 | 1.17 |

TABLE 7

Color data for Comparative Example 1

| Angle | L/ Cd/m² | u' | v' | x | y | CCTK | X | Y | Z | a* | b* | dE | JND |
|---|---|---|---|---|---|---|---|---|---|---|---|---|---|
| 0° | 434.9 | 0.192 | 0.460 | 0.298 | 0.317 | 7559 | 407.6 | 434.9 | 527.5 | 0 | 0 | 0 | 0 |
| 30° | 349.4 | 0.187 | 0.453 | 0.287 | 0.309 | 8498 | 324.8 | 349.4 | 456.1 | −1.25 | −4.62 | 4.79 | 2.08 |
| 60° | 118.2 | 0.179 | 0.459 | 0.281 | 0.320 | 8625 | 104.0 | 118.2 | 147.1 | −6.80 | −1.13 | 6.89 | 3.00 |

What is claimed is:

1. A display stack, comprising:
an emissive display including a plurality of organic light emitting diodes;
a circular polarizer; and
a color correction film disposed between the emissive display and the circular polarizer, the color correction film comprising:
a plurality of microlayers, each microlayer having a maximum difference among its three orthogonal refractive indices at 550 nm is less than or equal to 0.05, each microlayer having an average refractive index being the arithmetic average of the three orthogonal refractive indices at 550 nm;
wherein the plurality of microlayers are configured into layer pairs of alternating high and low index microlayers, and wherein the average refractive index of each high index microlayer is between 0.15 and 0.75 more than the average refractive index of each low index microlayer;
wherein the layer pairs each have optical thicknesses at 550 nm between 150 nm and 550 nm, and at least half of the layer pairs have optical thicknesses at 550 nm between 275 nm and 400 nm;
wherein the color correction film has few enough microlayers to transmit at least 80% of unpolarized visible light at normal incidence, photopically weighted; and
wherein the color correction film has enough microlayers to reflect at least 15% of at least one wavelength of unpolarized light at 60 degrees incidence.

2. The display stack of claim 1, wherein the color correction film has between 8 and 20 microlayers, inclusive.

3. The display stack of claim 1, wherein at least some of the plurality of microlayers of the color correction film include both inorganic and organic materials.

4. The display stack of claim 3, wherein at least some of the plurality of microlayers of the color correction film include inorganic materials dispersed in an organic matrix.

5. The display stack of claim 4, wherein the inorganic materials include metal oxides.

6. The display stack of claim 1, wherein the thickness of the plurality of microlayers of the color correction film is less than 3 micrometers.

7. The display stack of claim 1, wherein the thickness of the plurality of microlayers of the color correction film is less than 1 micrometer.

8. The display stack of claim 1, wherein the thickness of the plurality of microlayers of the color correction film is between 1.5 and 2.5 micrometers.

9. The display stack of claim 1, wherein the color correction film appears cyan in transmission at normal incidence.

10. The display stack of claim 1, wherein the color correction film appears magenta in transmission at 60 degrees incidence.

11. The display stack of claim 1, wherein the display stack, when the emissive display is fully on, exhibits a color shift between normal incidence and 60 degrees incidence of less than 2 JND.

12. The display stack of claim 11, wherein the color shift is less than 1.5 JND.

13. The display stack of claim 11, wherein the color shift is between 0.5 and 1.5 JND.

14. The display stack of claim 1, wherein the display stack, when the emissive display is fully on, exhibits a color shift between normal incidence and 60 degrees incidence along a* of less than 2.

15. The display stack of claim 1, wherein the display stack, when the emissive display is fully on, exhibits a color shift between normal incidence and 60 degrees incidence along b* of less than 6.

16. The display stack of claim 1, wherein the color correction film further comprises a substrate, and the plurality of microlayers is disposed on the substrate.

17. The display stack of claim 16, wherein the substrate is a polymeric substrate.

18. The display stack of claim 1, further comprising an optically clear adhesive attaching the color correction film to one of the circular polarizer or the emissive display.

19. The display stack of claim 1, wherein the color correction film further comprises a protective layer disposed on the plurality of microlayers.

20. The display stack of claim 1, wherein the protective layer is a hardcoat.

* * * * *